(12) United States Patent
Takeuchi

(10) Patent No.: US 6,646,317 B2
(45) Date of Patent: Nov. 11, 2003

(54) HIGH POWER PHOTODIODE

(75) Inventor: Takeshi Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/986,571

(22) Filed: Nov. 9, 2001

(65) Prior Publication Data

US 2002/0088992 A1 Jul. 11, 2002

(30) Foreign Application Priority Data

Nov. 9, 2000 (JP) ........................................ 2000-341335

(51) Int. Cl.[7] ................... H01L 31/0232; H01L 31/062; H01L 31/113; H01P 1/20
(52) U.S. Cl. ................... 257/436; 257/432; 257/292; 257/293; 333/210
(58) Field of Search ................................ 257/432, 292, 257/293, 436; 333/210; 438/48

(56) References Cited

U.S. PATENT DOCUMENTS 5,521,994 A * 5/1996 Takeuchi et al. ............... 385/14
5,727,096 A * 3/1998 Ghirardi et al. ............... 385/14
5,747,860 A * 5/1998 Sugiyama et al. ............. 257/19
5,796,118 A * 8/1998 Morikawa et al. ............. 257/19
5,910,012 A * 6/1999 Takeuchi ..................... 438/31

OTHER PUBLICATIONS

T. Takeuchi et al., "High–Speed, High–Power and High–Efficiency Photodiodes with Evanescently Coupled Graded–Index Waveguide," *Electronics Letters*, v. 36, 2000, pp. 1–2.
*60th Convention of Japanese Institute of Applied Physics, Proceedings*, Part 3, Lecture No. 1p–Zc–8, Fall 1999, p. 985.

* cited by examiner

Primary Examiner—Steven Loke
Assistant Examiner—Samuel A Gebremariam
(74) Attorney, Agent, or Firm—Young & Thompson

(57) ABSTRACT

An evanescently coupled photodiode of the invention has a semiconductor substrate 1, a guide layer 3 being greater in refractive index than the semiconductor substrate, and an absorption layer 4 on a partial area of said guide layer formed in it. The mesa width of a PD region in which the absorption layer and the guide layer are formed is made wider at a part where the density of a photoelectric current is higher when the photodiode operates and more narrow at a part where the density of a photoelectric current is lower.

20 Claims, 5 Drawing Sheets

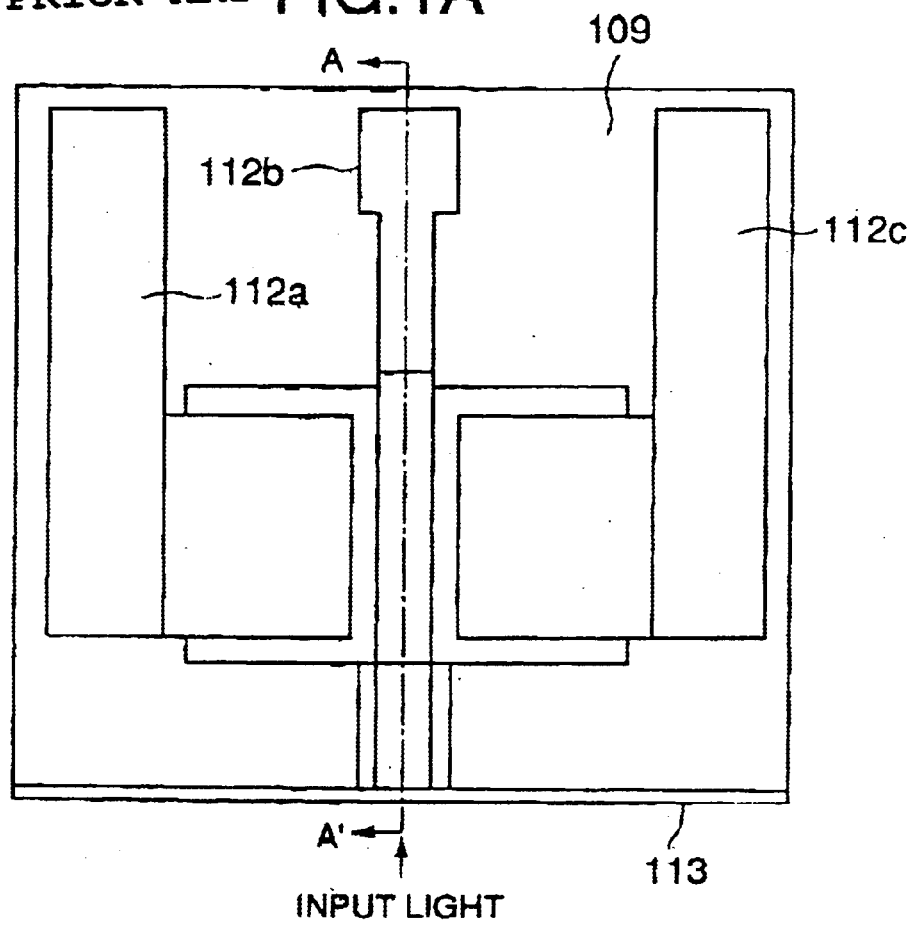
PRIOR ART FIG.1A
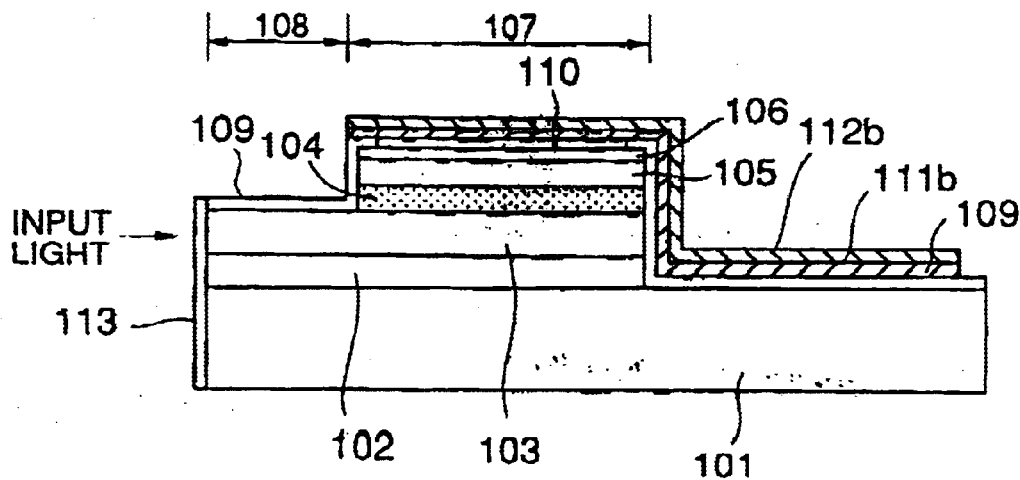
PRIOR ART FIG.1B

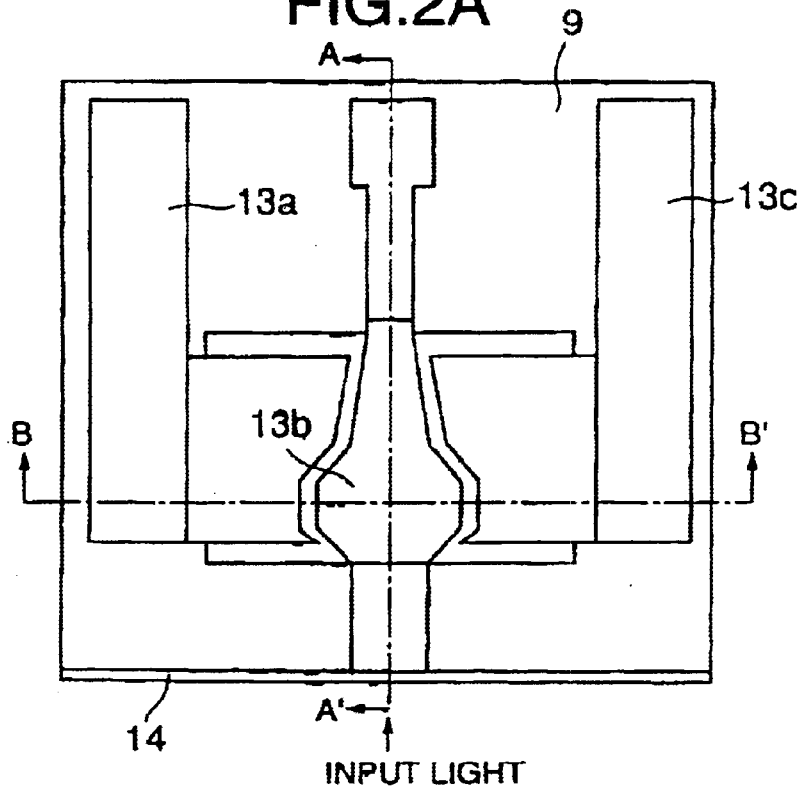
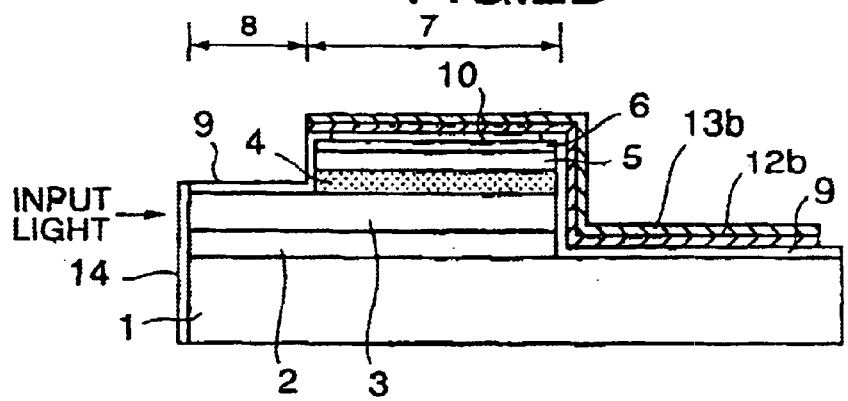
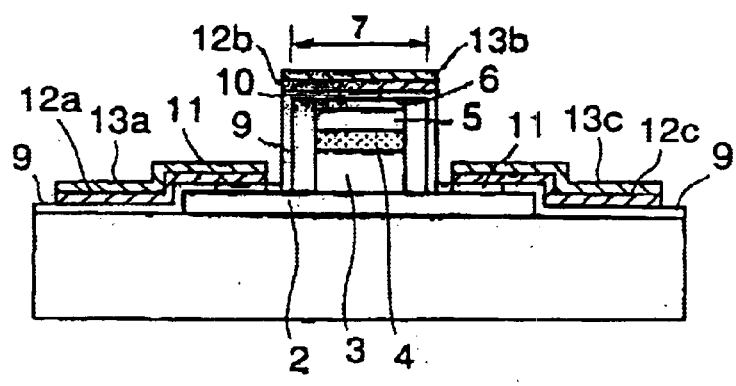

HIGH POWER PHOTODIODE

BACKGROUND OF THE INVENTION

1. Field of the Invention

The present invention relates to a photodiode (semiconductor light receiving element) used in a receiving module of an optical communication system. More particularly the present invention relates to the photodiode for having a signal light inputted in parallel with a substrate and performing a photoelectric conversion on it.

2. Description of Related Art

As a photodiode used in a receiving module of an optical communication system, there are waveguide photodiode and an evanescently coupled photodiode.

Since a conventional waveguide photodiode has a structure in which an absorption layer of an input face is directly irradiated with an input light, a photoelectric current tends to concentrate near the input face. For example, in case that a high-intensity light such as an output light from an Erbium-doped fiber preamplifier is inputted, there has been a problem that the input face of a waveguide photodiode is liable to be destroyed.

On the other hand, an evanescently coupled photodiode has a structure in which a signal light is inputted to a guide layer being a transparent semiconductor layer the signal light and is wave-guided from the input portion to a PD region (photoelectric converter portion) formed at a distance of several ten microns or more from the input portion. In a PD region (photoelectric converter portion) of an evanescently coupled photodiode a light exuding in the direction of layer thickness from a guide layer (an evanescent wave) is photoelectrically converted in an absorption layer. Therefore, since an input light is indirectly coupled with an absorption layer in the PD region, concentration of a photoelectric current in the vicinity of an input face is more relieved in comparison with a waveguide photodiode and the input face is made to be hard to destroy even in case of having a high-intensity light inputted to it.

Examples of such an evanescently coupled photodiode having the resistance to a high-intensity optical input has been reported, in "60th Convention of Japanese Institute of Applied Physics in Fall 1999, Proceedings Part 3, pp.985, Lecture No.1p-ZC-8" (Reference paper 1) and in "ELECTRONICS letters 25th May 2000, Vol.36, No.11, pp.1–2" (Reference paper 2).

FIG. 1A and FIG. 1B show the basic structure of an evanescently coupled photodiode reported in reference paper 1, and as shown in FIG. 1B, FIG. 1A is a plan view of a prior art example and FIG. 1B is a sectional view of it taken along line A–A'. As shown in FIG. 1B, this photodiode has a layered structure comprising an $n^+$-InP clad layer 102, an $n^+$-InAlGaAs guide layer (of 1.3 $\mu$m in wavelength and 1 $\mu$m in layer thickness) 103, an i-InGaAs absorption layer 104 (of 0.5 $\mu$m in layer thickness), a $p^+$-InP clad layer 105 and a $p^+$-InGaAs contact layer 106 which are formed on a semi-insulating InP substrate 101. In this evanescently coupled photodiode, an input waveguide region 108 is formed over a length of 20 $\mu$m from the input face and a PD region (photoelectric converter portion) 107 is formed at the back of this input waveguide region. This input waveguide region is an optical waveguide having the $n^+$-InAlGaAs guide layer 103 as a core layer. The PD region 107 is formed at the back of the input waveguide region. Reference paper 1 has reported that an evanescently coupled photodiode is not deteriorated even in a state of having a high-intensity light of 10 mA in photoelectric current inputted into it.

An evanescently coupled photodiode has a structure in which a PD region 7 is formed distantly from an end face having a signal light inputted to it and there is not a semiconductor layer in front of (between an input face and) an i-InGaAs absorption layer 4. Due to this, differently from a conventional waveguide photodiode, light is little inputted through a side face of the i-InGaAs absorption layer 4 near the input face. Accordingly, the density of a photoelectric current in the vicinity of this side face is very low. In case of comparing this embodiment with a conventional evanescently coupled photodiode, in such a way the conventional evanescently coupled photodiode is increased more in resistance to a high-intensity optical input in comparison with a conventional waveguide photodiode, but its resistance to the high-intensity optical input has not necessarily been sufficient in practical use. Even in the evanescently coupled photodiode, heat locally generated in an area where the density of a photoelectric current is high at the input side of the PD region may sometimes exceed the resistance of the photodiode.

SUMMARY OF THE INVENTION

An object of the present invention is to provide a photodiode for having a signal light inputted in parallel with a substrate and performing a photoelectric conversion on it, said photodiode being more improved in resistance to a high-intensity optical input.

In order to attain the above object, according to an aspect of the present invention, there is provided an evanescently coupled photodiode comprising a semiconductor substrate, a guide layer which is made of a semiconductor material whose band gap wavelength is shorter than the wavelength of an input light, said semiconductor material being larger in refractive index than said semiconductor substrate, and which has a signal light inputted to it, an absorption layer which is made of a semiconductor material whose band gap wavelength is equal to or longer than the wavelength of an input signal light and which is formed distantly from the input face of the guide layer and in which a signal light is evanescent-wave-coupled, and a PD region for performing a photoelectric conversion on a signal light inputted in parallel with the semiconductor substrate in an area including at least the guide layer and the absorption layer, wherein the mesa width of the PD region is made wider near the end portion at the side to which a signal light is inputted and more narrow near the end portion at the opposite side to it. And in order to attain the above object, according to another aspect of the present invention, there is provided a waveguide photodiode comprising a semiconductor substrate, an absorption layer made of a semiconductor material whose band gap wavelength is equal to or longer than the wavelength of an input signal light, and a PD region for performing a photoelectric conversion on a signal light inputted in parallel with said semiconductor substrate in an area including at least said absorption layer, wherein the mesa width of said PD region is made wider near the end portion at the side to which a signal light is inputted and more narrow near the end portion at the opposite side to it.

BRIEF DESCRIPTION OF THE DRAWINGS

FIGS. 1A and 1B are a plan view and a sectional view of a conventional evanescently coupled photodiode.

FIGS. 2A to 2C are a plan view and sectional views of a first embodiment related to an evanescently coupled photodiode of the present invention.

DESCRIPTION OF THE PREFERRED EMBODIMENTS

Figure 3:
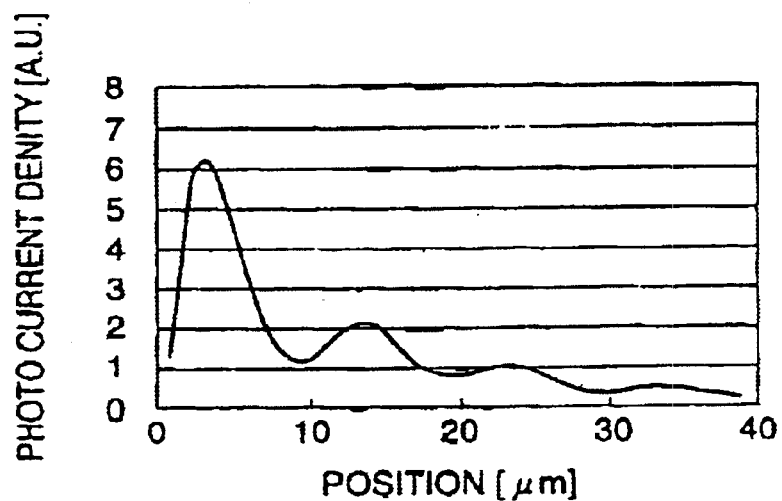
FIG. 3 is a graph obtained by calculating the density of a photoelectric current within a PD region when inputting light into the evanescently coupled photodiode.

Next, embodiments of the present invention are described in detail with reference to the drawings.

FIG. 2A is a plan view showing a first embodiment of the present invention. FIGS. 2B and 2C are respectively sectional views of FIG. 2A taken along lines A–A' and B–B'.

When manufacturing this embodiment, on a semi-insulating InP substrate 1 are deposited in order an $n^+$-InP clad layer 2 (of 0.5 $\mu$m in layer thickness), an $n^+$-InAlGaAs guide layer 3 (of 1.3 $\mu$m in wavelength and 0.7 $\mu$m in layer thickness), an i-InGaAs absorption layer 4 (of 0.5 $\mu$m in layer thickness), a $p^+$-InP clad layer 5 (of 1 $\mu$m in layer thickness) and a $p^+$-InGaAs contact layer 6. And as shown in FIGS. 2B and 2C, the following four regions are formed using a plurality of etching processes being different in depth. That is to say, these regions are a region obtained by etching until the semi-insulating InP substrate 1 is exposed, a region obtained by etching until the $n^+$-InP clad layer 2 is exposed, a region obtained by etching until the $n^+$-InAlGaAs guide layer 3 is exposed, and a region obtained by leaving the $p^+$-InGaAs contact layer 6 not etched. This region where the $p^+$-InGaAs contact layer 6 is left is a PD region 7 for performing a photoelectric conversion on an input light. And the region which is etched until the $n^+$-InAlGaAs guide layer 3 is exposed is an input waveguide region 8 for wave-guiding an input light to the PD region 7.

Hereupon, as shown in FIG. 2A, the width of the waveguide mesa of the PD region 7 expands linearly toward the light waveguide from the light input side and then is kept constant and thereafter gradually decreases (linearly decreases in two stages). The PD region 7 and the input waveguide region 8 are respectively 40 $\mu$m and 20 $\mu$m in length (dimensions in the direction shown in FIG. 2B). Further, as shown in FIGS. 2B and 2C, a silicon nitride film 9 is formed on the upper and side faces of the PD region 7 where a mesa is formed. And the silicon nitride film 9 is partially removed from the region where the $p^+$-InGaAs contact layer 6 is left and the region where the $n^+$-InP clad layer 2 is exposed. On the silicon nitride film removed region are formed an AuZn alloy electrode 10 as a p side electrode and an AuGeNi alloy electrode 11 as an n side electrode.

As shown in FIGS. 2A to 2C, TiPtAu electrodes 12a, 12b and 12c expanding and extending the AuZn alloy electrode 10 and the AuGeNi alloy electrode 11 are formed. Further, Au-plated electrodes 13a, 13b and 13c reinforcing them are formed on these TiPtAu electrodes. And a silicon nitride film 14 is formed as an antireflection coating on the input face of the photodiode.

In this embodiment, a signal light is inputted from the position shown by arrows in FIGS. 2A and 2B. The wavelength of this input light is assumed to be 1.55 $\mu$m band being a wavelength band usually used in an optical communication system. The input light propagates through the $n^+$-InAlGaAs guide layer 3 as a core layer for optical waveguide and exudes to the absorption layer 4 and is photoelectrically converted in the PD region 7 and is taken out as an electric signal to an external electric circuit connected to the Au-plated electrodes 13a, 13b and 13c.

In this embodiment, a photodiode is hard to deteriorate or destroy even against a high-intensity optical input. A point in which this embodiment is different from the conventional evanescently coupled photodiode of FIG. 1 is described. As shown in FIG. 1A, in the conventional evanescently coupled photodiode, the width of the PD region 107 is constant. On the other hand, as shown in FIG. 2A, in the first embodiment, the width of the mesa of the PD region 7 is made wider at the input side of the PD region 7 where the density of a photoelectric current becomes higher.

FIG. 3 is a graph showing an example obtained by calculating the density of a photoelectric current within the PD region when inputting a light into a conventional evanescently coupled photodiode. As shown in the figure, the density of a photoelectric current has a high peak at a distance of several microns from the input side and gradually damps while repeating increment and decrement as becoming more and more distant from the input side. This behavior reflects a phenomenon that in an evanescently coupled photodiode a light inputting to an $n^+$-InAlGaAs guide layer is wave-guided moving zigzag up and down between an i-InGaAs absorption layer and an $n^+$-InAlGaAs guide layer in a PD region and is gradually absorbed. And the higher the density of photoelectric current is, the greater mount of heat is locally generated and the portion having a great amount of heat generated is destroyed by a high-intensity optical input.

The first embodiment makes wider the mesa width of a portion having a high density of a photoelectric current (having a great heat generation). This shape relieves a local concentration of electric current and suppresses a local temperature rise when a high-intensity optical input is performed. Therefore, the first embodiment makes a photodiode be more difficult to destroy than the prior art. Further, this embodiment makes more narrow the mesa width in a part being lower in density of photoelectric current (in a part having a smaller heat generation). Accordingly this shape prevents the increase in capacity of a photodiode due to increase in area of a mesa and keeps a high response speed of a photodiode.

Figure 4:
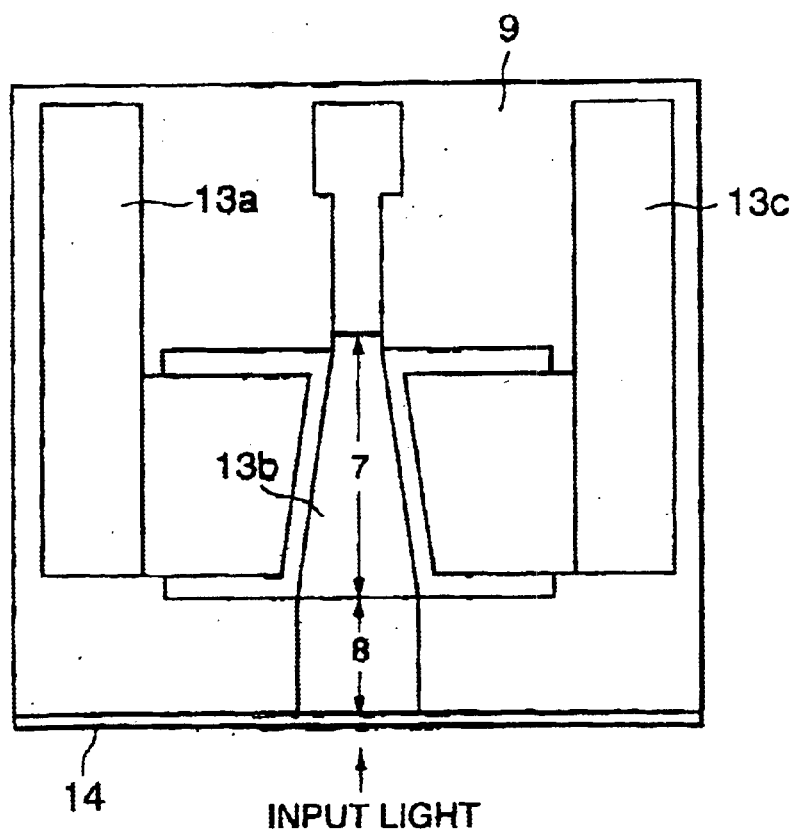
FIG. 4 is a plan view of a second embodiment related to an evanescently coupled photodiode of the present invention.

FIG. 4 is a plan view showing a second embodiment of the present invention. A point in which the second embodiment is different from the first embodiment can be easily understood by comparing FIG. 4 with FIG. 2A of the first embodiment. That is to say, as shown in FIG. 4, the different point is that the shape of the mesa of the PD region 7 is a tapered shape in which it is wider at the input side and more narrow at the rear end. The basic layered structure of the photodiode is the same as the first embodiment.

Since the second embodiment is simpler in mesa shape in comparison with the first embodiment, the second embodiment is easier to manufacture a photodiode than the first embodiment and improves more the yield of manufacture. And nearly in the same degree as the first embodiment, the second embodiment provides an effect that a photodiode is hard to destroy even in case of high-intensity optical input and an effect that the increase in capacity of a photodiode due to the increase in mesa area can be prevented. Further, the second embodiment can make wider the mesa width of the input waveguide region 8 adaptively to the mesa width of the input side of the PD region 7. Due to this, the coupling efficiency with an input light in the horizontal direction is improved and high quantum efficiency can be obtained.

In the first and second embodiments as described above, an example of an evanescently coupled photodiode in which an input waveguide region 8 is formed in front of a PD region 7 has been shown. However, the present invention can be applied to not only an evanescently coupled photodiode but also an ordinary waveguide photodiode.

Figure 7:
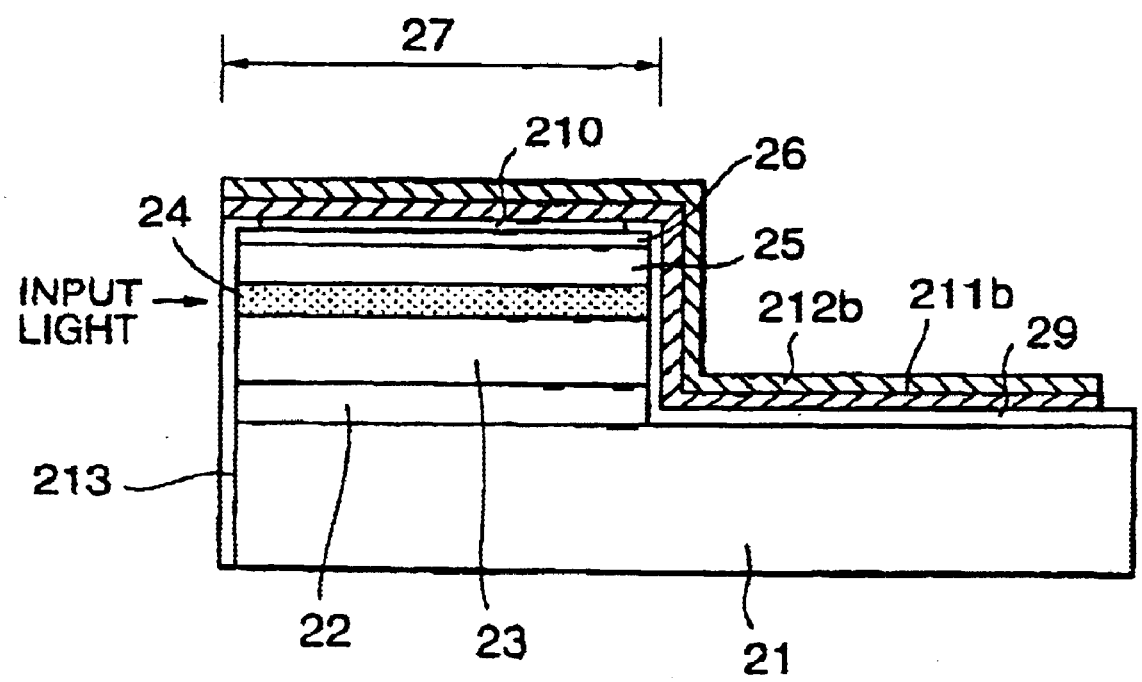
FIG. 7 is a sectional view of a waveguide photodiode of the present invention.

FIG. 7 is a sectional view of a waveguide photodiode. This waveguide photodiode has a layered structure in which on a semi-insulating InP substrate 21 are formed an n$^+$-InP clad layer 22, an n$^+$-InAlGaAs guide layer 23 (of 1.3 $\mu$m in wavelength and 1 $\mu$m in layer thickness), an i-InGaAs absorption layer 24 (of 0.5 $\mu$m in layer thickness), a p$^+$-InP clad layer 25 and a p$^+$-InGaAs contact layer 26. A silicon nitride film 29 is formed on the upper and side faces of the PD region 27 where a mesa is formed. And the silicon nitride film 29 is partially removed from the region where the p$^+$-InGaAs contact layer 26 is left and the region where the n$^+$-InP clad layer 22 is exposed. On the silicon nitride film removed region are formed an AuZn alloy electrode 210 as a p side electrode and an AuGeNi alloy electrode 211b as an n side electrode. A TiPtAu electrode 212b expanding and extending the AuZn alloy electrode 210 and the AuGeNi alloy electrode 211b is formed. Further, an Au-plated electrode reinforcing the TiPtAu electrode is formed on the TiPtAu electrode 212b. And a silicon nitride film 213 is formed as an antireflection coating on the input face of the photodiode.

A waveguide photodiode has a structure in which there is no input waveguide region and a light is directly inputted into a PD region 27. In such a waveguide photodiode also, it is possible to obtain a photodiode being hard to destroy even when having a high-intensity optical input and having a high response speed by making the mesa width of the PD region wider at a spot having a higher photoelectric current density and more narrow at a spot having a lower photoelectric current density. And in the same way as the second embodiment, it is possible to obtain an effect of improvement in yield of manufacture and an effect of improvement in quantum efficiency of a photodiode in addition to the effect of the first embodiment by making the mesa width of the PD region wider at the input side and more narrow at the rear side.

Figure 5:
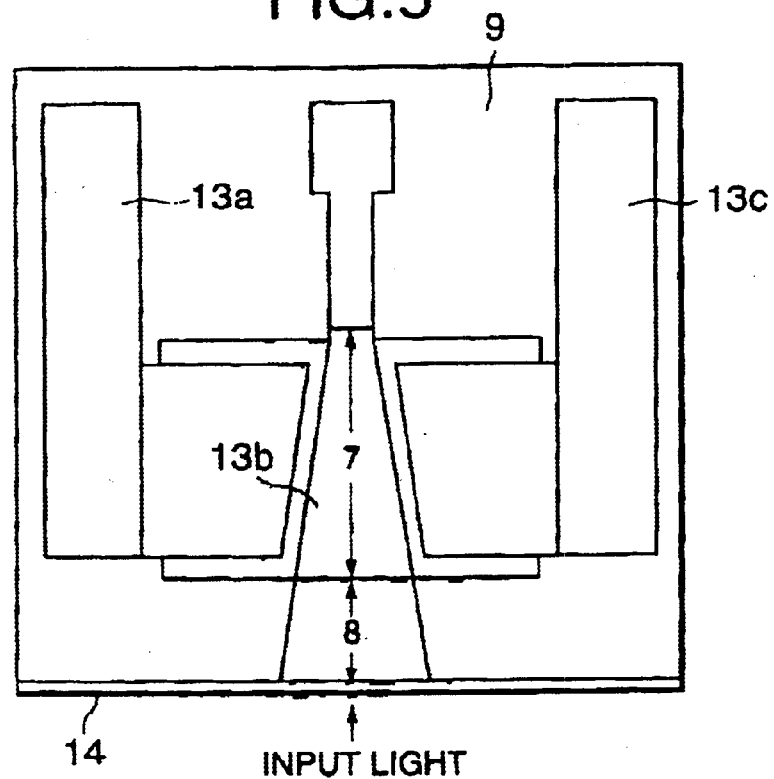
FIG. 5 is a plan view of a third embodiment related to an evanescently coupled photodiode of the present invention.

FIG. 5 is a plan view showing a third embodiment of the present invention.

In the third embodiment like the second embodiment, the mesa of the PD region 7 is made wider at the input side and more narrow at the rear end side. Additionally in the third embodiment, the mesa width of the input waveguide region 8 also is made wider at the input side. In the other points, the basic structure of the photodiode is the same as the first or second embodiment.

In the third embodiment, since the mesa width of the input waveguide region 8 is made wider at the input side, the efficiency of coupling in the horizontal direction is made higher in comparison with the second embodiment and a high quantum efficiency can be obtained.

The third embodiment shows an example in which the mesa width of the input waveguide region 8 in the second embodiment is made wider at the input side.

Similarly also in case of making wider the mesa width of the input waveguide region 8 at the input side in the third embodiment, an effect that a coupling efficiency in the horizontal direction is improved and a high quantum efficiency is obtained is brought in the same way.

FIG. 5 shows only a plan view of an evanescently coupled photodiode, but since a plan view of a waveguide photodiode is apparently understood from the matter already described, duplicated description is omitted.

Figure 6:
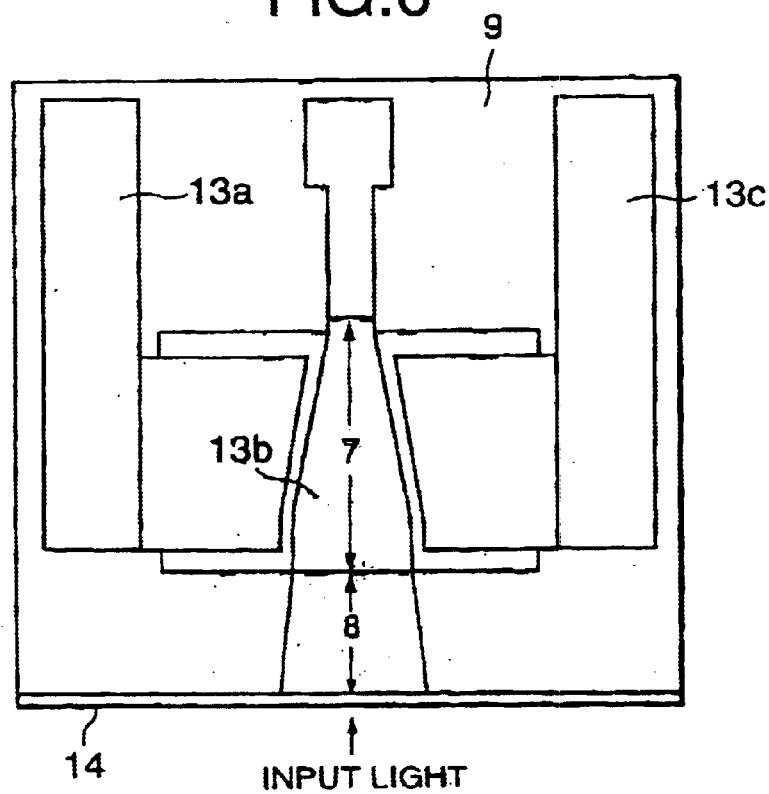
FIG. 6 is a plan view of a fourth embodiment related to an evanescently coupled photodiode of the present invention.

FIG. 6 is a plan view showing a fourth embodiment of the present invention. In the fourth embodiment like the third embodiment, the mesa width of the input waveguide region 8 is made wider at the input side. The fourth embodiment is different from the third embodiment in that the mesa width of the PD region 7 is kept constant just before a spot where the density of a photoelectric current is made nearly the maximum from the optical input side and thereafter decreases linearly along the waveguide direction. The basic structure of the photodiode other than this is the same as the third embodiment.

This fourth embodiment can provide all the effects of the third embodiment and additionally can make the area of the PD region 7 more narrow than the third embodiment and realize a photodiode being higher in response speed.

The fourth embodiment shows an example in which the mesa width of the PD region 7 is kept constant from the input side and thereafter is gradually reduced in the third embodiment, but by making the shape of the PD region in the second embodiment similar to the fourth embodiment, an effect similar to the fourth embodiment being capable of realizing a photodiode having a higher response speed.

Although the first to fourth embodiments have been described, the present invention is not limited to these embodiments but can be properly modified without departing from the scope and essentials of the present invention. For example, the embodiments have described the case that the PD region has a pin photodiode structure, but without being limited to them it may have an avalanche photodiode structure, a Schottky photodiode structure and other photodiode structures. And as a material for a guide layer InGaAsP can be used in place of InAlGaAs and materials and their compositions may be properly changed. And in the waveguide structure of an evanescently coupled photodiode a guide layer may be provided on an absorption layer and may be provided on the upper and lower sides of the absorption layer.

As described above, a photodiode according to the present invention has a structure in which the waveguide mesa width of the PD region is made wider at a position where the density of a photoelectric current is higher and more narrow at a position where the density of a photoelectric current is lower. This structure can reduce variation in photoelectric current density and suppress a local temperature rise when having a high-intensity optical input. Further, since the area of a part being low in photoelectric current density can be reduced, it is possible to reduce the capacity of a photodiode. Accordingly, it is possible to enhance the resistance to a high-intensity optical input and realize a high response speed.

Modifications of the invention herein disclosed will occur to a person skilled in the art and all such modifications are deemed to be written the scope of the invention as defined by appended claims.

What is claimed is:

1. An evanescently coupled photodiode comprising;
   a semiconductor substrate,
   a guide layer which is made of a semiconductor material whose band gap wavelength is shorter than a wavelength of an input light, said semiconductor material being larger in refractive index than said semiconductor substrate, and which has said light inputted to it, an absorption layer which is made of a semiconductor material whose band gap wavelength is equal to or longer than the wavelength of said input light and which is formed distantly from an input face of said guide layer and in which said input light is evanescent-wave-coupled, and a photodiode region for performing a photoelectric conversion on said input light inputted in parallel with respect to a horizontal plane of said semiconductor substrate in an area including at least said guide layer and said absorption layer, wherein;

a mesa width of said photodiode region is made wider near a first end portion at a side to which said input light is inputted and more narrow near a second end portion at an opposite side to which said input light is inputted.

2. An evanescently coupled photodiode according to claim 1, wherein;
said mesa width of said photodiode region is made wider and then is kept constant in width, and thereafter is linearly decreased.

3. An evanescently coupled photodiode according to claim 1, wherein;
said mesa width of said photodiode region is reduced along a direction of said input light.

4. An evanescently coupled photodiode according to claim 1, wherein;
said mesa width of said photodiode region varies along a direction of said input light so as to be a maximum near said first end portion and a minimum near the end part of the opposite side to it said second end portion.

5. An evanescently coupled photodiode according to claim 1, wherein;
a mesa width of an input waveguides region of an area in which an absorption layer is not formed at the input side of said guide layer decreases along a waveguide direction from an input face of said input waveguide region.

6. An evanescently coupled photodiode according to claim 1, wherein;
a structure of said photodiode region is a structure selected from a group consisting of a pin photodiode structure, an avalanche photodiode structure and a Schottky photodiode structure.

7. An evanescently coupled photodiode according to claim 1, wherein;
said absorption layer is made of InGaAs, and said guide layer is made of InAlGaAs or InGaAsP.

8. An evanescently coupled photodiode comprising;
a semiconductor substrate,
a guide layer which is made of a semiconductor material whose band gap wavelength is shorter than a wavelength of an input light, said semiconductor material being larger in refractive index than said semiconductor substrate, and which has said light inputted to it,
an absorption layer which is made of a semiconductor material whose band gap wavelength is equal to or longer than the wavelength of said input light and which is formed distantly from an input face of said guide layer and in which said input light is evanescent-wave coupled, and
a photodiode region for performing a photoelectric conversion on said input light inputted in parallel with respect to a horizontal plane of said semiconductor substrate in an area including at least said guide layer and said absorption layer, wherein;
a mesa width of said photodiode region is made wider near a first end portion at a side to which said input light is inputted and more narrow near a second end portion at an opposite side to which said input light is inputted, and is made wider according to a density of a photoelectric current in said photodiode region.

9. An evanescently coupled photodiode according to claim 8, wherein:
a mesa width of an input waveguide region of an area in which an absorption layer is not formed at the input side of said guide layer decreases along a waveguide direction from an input face of said input waveguide region.

10. An evanescently coupled photodiode according to claim 8, wherein;
a structure of said photodiode region is a structure selected from a group consisting of a pin photodiode structure, an avalanche photodiode structure and a Schottky photodiode structure.

11. An evanescently coupled photodiode according to claim 8, wherein;
said absorption layer is made of InGaAs, and said guide layer is made of InAlGaAs or InGaAsP.

12. A waveguide photodiode (waveguide semiconductor light receiving element) comprising;
a semiconductor substrate,
an absorption layer made of a semiconductor material whose band gap wavelength is equal to or longer than a wavelength of an input light, and
a photodiode region for performing a photoelectric conversion on said input light inputted in parallel with respect to a horizontal plane of the semiconductor substrate in an area including at least said absorption layer, wherein;
a mesa width of said photodiode region is made wider near a first end portion at a side to which said input light is inputted and more narrow near a second end portion at an opposite side to which said input light is inputted.

13. A waveguide photodiode according to claim 12, wherein;
said mesa width of said photodiode region is made wider and then is kept constant in width, and thereafter is linearly decreased.

14. A waveguide photodiode according to claim 12, wherein;
said mesa width of said photodiode region is reduced along a direction of said input light.

15. A waveguide photodiode according to claim 12, wherein;
said mesa width of said photodiode region varies along a direction of said input light so au to be a maximum near said first end portion and a minimum near said second end portion.

16. A waveguide photodiode according to claim 9, wherein;
said absorption layer is made of InGaAs, and said guide layer is made of InAlGaAs or InGaAsP.

17. A waveguide photodiode according to claim 12, wherein;
said guide layer is formed on at least one of upper and lower faces of said absorption layer.

18. A waveguide photodiode (waveguide semiconductor light receiving element) comprising a semiconductor substrate, an absorption layer made of a semiconductor material whose band gap wavelength is equal to or longer than a wavelength of an input light, and a photodiode region for performing a photoelectric conversion on said input light inputted in parallel with respect to a horizontal plane of the semiconductor substrate in an area including at least said absorption layer, wherein;

a mesa width of said photodiode region is made wider near a first end portion at a side to which said input light is inputted and more narrow near a second end portion at an opposite side to which said input light is inputted, and a mesa width of a part of said photodiode region is made wider according to a density of a photoelectric current in said photodiode region.

19. A waveguide photodiode according to claim 18, wherein;

said absorption layer is made of InGaAs, and said guide layer is made of InAlGaAs or InGaAsP.

20. A waveguide photodiode according to claim 18, wherein;

said guide layer is formed on at least one of upper and lower faces of said absorption layer.

* * * * *